Figure 1:
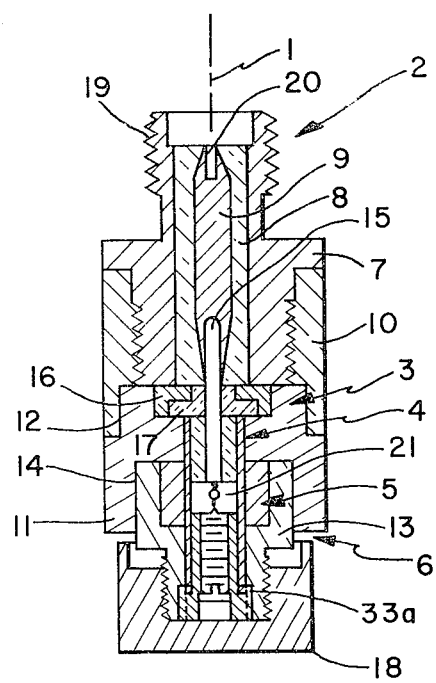

United States Patent [19]

Kozul et al.

[11] 3,939,446

[45] Feb. 17, 1976

[54] MILLIMETER WAVE TRANSLATING DEVICE WITH CHANGEABLE INSERT ELEMENT

[76] Inventors: Theodore L. Kozul, 19 Wright Ave., Medford, Mass. 01757; Paul A. Crandell, 6 Parker Road, Bedford, Mass. 01730

[22] Filed: Nov. 1, 1973

[21] Appl. No.: 411,798

Related U.S. Application Data

[60] Continuation of Ser. No. 245,930, April 20, 1972, which is a division of Ser. No. 875,755, Nov. 12, 1969, Pat. No. 3,681,718.

[52] U.S. Cl. .............................. 333/98 R; 333/24 R
[51] Int. Cl. ..................... H01p 1/00; H01p 11/00
[58] Field of Search ................. 333/98 R, 24 R; 329/161–162; 321/69 W

[56] References Cited
UNITED STATES PATENTS

| | | | |
|---|---|---|---|
| 2,419,613 | 4/1947 | Webber | 329/161 |
| 2,484,256 | 10/1949 | Vaughan | 329/161 |
| 2,685,028 | 7/1954 | Ditchfield | 329/161 |
| 2,871,353 | 1/1959 | Friis et al. | 329/161 |
| 3,066,290 | 11/1962 | Whitehorn | 333/24 |
| 3,165,690 | 1/1965 | Kaufman | 333/73 W |
| 3,443,244 | 5/1969 | Cook | 333/83 R |

*Primary Examiner*—Alfred E. Smith
*Assistant Examiner*—Wm. H. Punter
*Attorney, Agent, or Firm*—Robert T. Dunn

[57] ABSTRACT

An extra high frequency (EHF or millimeter wave length) translating device for detecting, multiplying frequency or mixing waves includes an extra high frequency cut off input transmission line mechanically joined by a housing in which there is a cavity loaded with a removable insert. The insert contains a wave coupling element such as a diode mixer, multiplier, detector, etc. and is so mounted in the insert that it couples with the electric field of waves in the input line and is electrically connected with the relatively lower cut off frequency line output line. The insert also contains a choke so disposed that the extra high frequency waves conducted by the input line do not couple to the output line and so the output taken from the relatively low frequency cut off output line is substantially free of extra high frequency signals.

5 Claims, 15 Drawing Figures

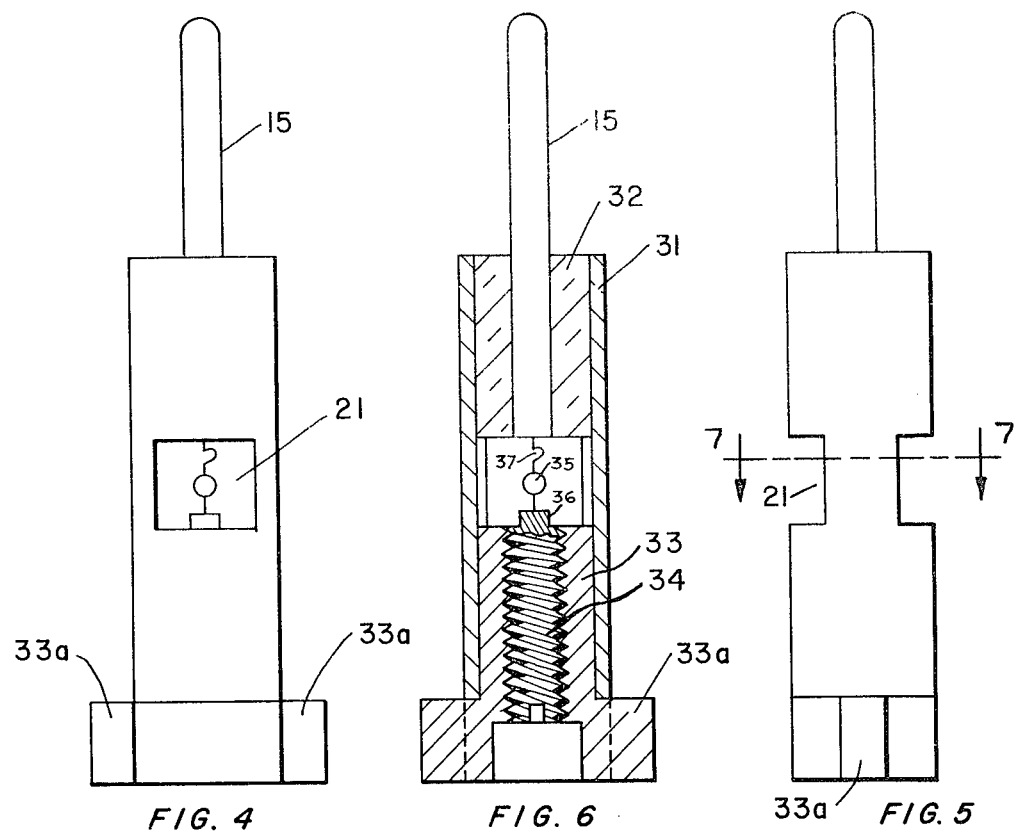
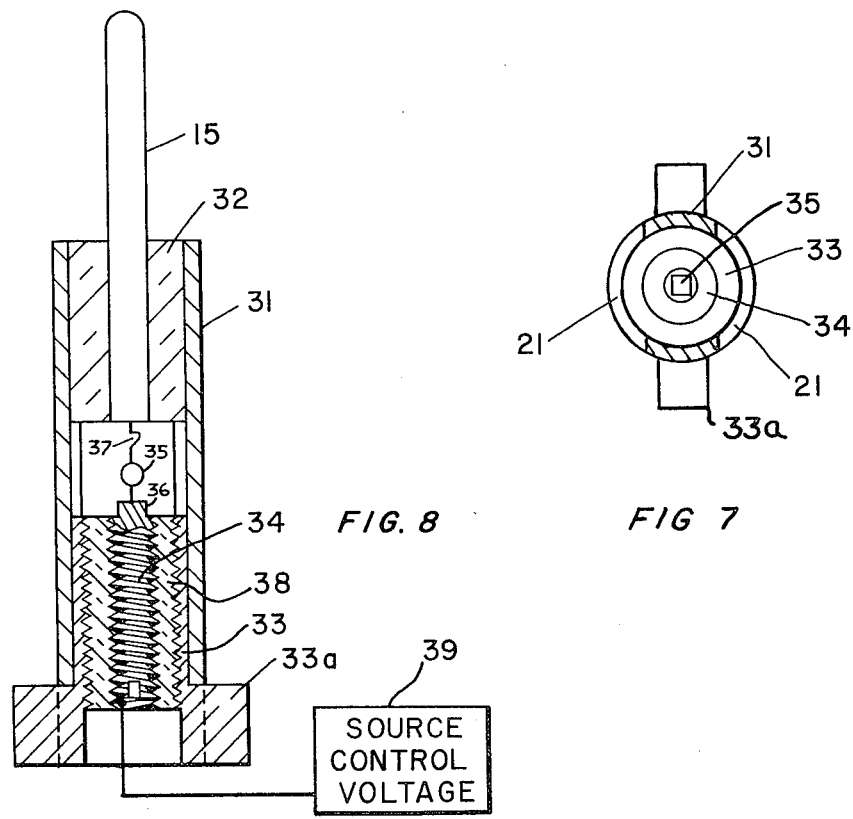

MILLIMETER WAVE TRANSLATING DEVICE WITH CHANGEABLE INSERT ELEMENT

This is a continuation of application Ser. No. 245,930, filed Apr. 20, 1972, which is a division of application Ser. No. 875,755, filed Nov. 12, 1969, now U.S. Pat. No. 3,681,718.

This invention relates to millimeter wave translating devices for coupling signals carried by extra high frequency waves in the millimeter wave length range to an output transmission line and more particularly to such a device for measuring, mixing, monitoring, detecting or multiplying millimeter wave signals.

Heretofore, translating devices for detecting extra high frequency waves in the millimeter wave length range which are generally defined as a few millimeters to a fraction of a millimeter in length have included a semiconductor or crystal detector element mounted in a waveguide so that the electric field of waves in the guide are most effective to energize the element. The output from such a device is obtained from a lead connected to the element. The element is located in the waveguide so as to produce the least reflection and the waveguide is terminated with an impedance matching device which may be a tuning piston and/or reactance matching screws in the waveguide. The complete structure including the input waveguide transmission line and the output line and the element is a fixed structure in which the element cannot be readily changed or replaced without destroying the structure. Furthermore, an undesirable amount of millimeter wave energy is coupled to the output line and appears in the output signal.

It is one object of the present invention to provide a millimeter wave translating device of the sort described above and in which the element is readily removed and replaced.

It is another object of the present invention to provide a millimeter wave translating device of the sort described above in which a negligible amount of millimeter wave frequency signal appears in the output.

It is another object of the present invention to provide a millimeter wave translating device of the sort described above and including a choke which prevents the millimeter wave frequency energy from being conducted by the output line.

A further object of the invention is to provide such a choke which is readily removed and replaced.

In a preferred embodiment of the invention, a waveguide transmission line for conducting millimeter wave frequency signals and an output coaxial transmission line are connected by a housing which contains a removable insert loaded with a nonlinear wave coupling element such as a diode detector, multiplier, mixer, square law detector, thermistor, etc. The element is so mounted in the insert that the electric field of the millimeter waves couple strongly with it and the element connects electrically to the output line. In one embodiment called herein a replaceable in-line detector, the insert is cartridge-shaped and the output line is a coaxial line which extends from one end of the cartridge and has a radial quarter wave choke structure in between which provides a non-reflective termination for selected millimeter wave frequencies thereby eliminating the selected frequencies from the output line. The cartridge is generally cylindrical in shape in axial alignment with the output line and the choke is formed when the housing is assembled.

In another embodiment called herein a replaceable wafer mounted detector, the insert is wafer-shaped and the detector element is mounted in a wafer which also contains the output coaxial line and choke. The wafer is designed to be readily removed and replaced by sliding it in or out of a slot in the housing in a direction transverse to both the axis of the waveguide and the output coaxial line.

Figure 2:
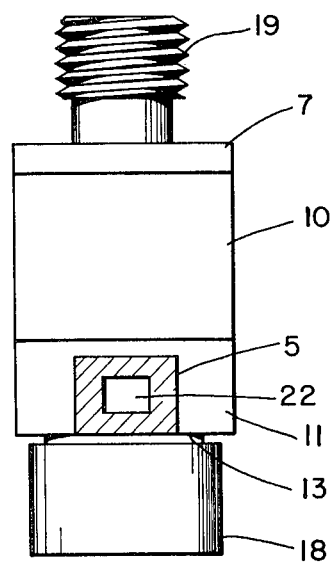
Figure 3:
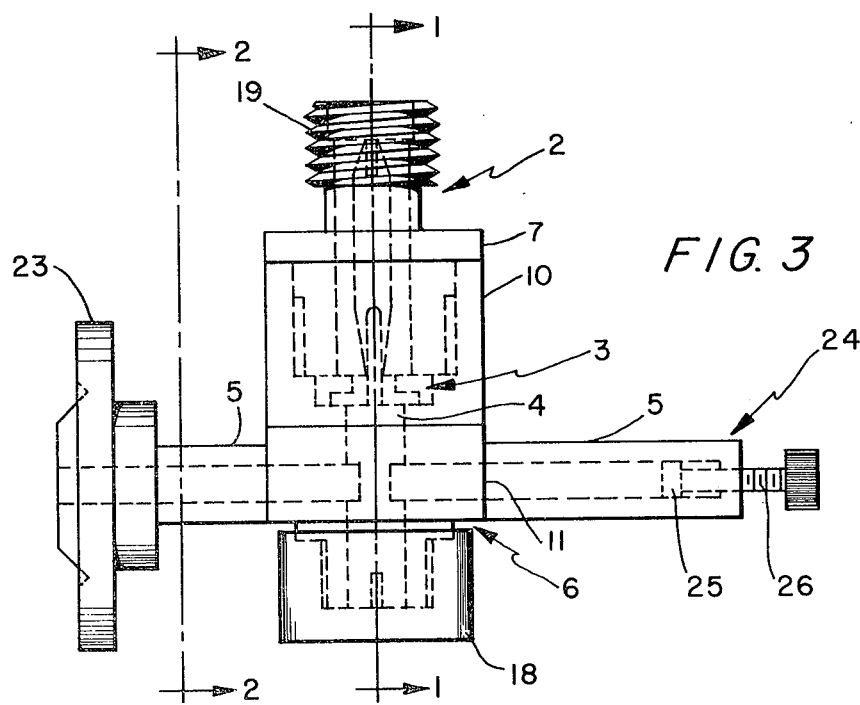
Figure 9:
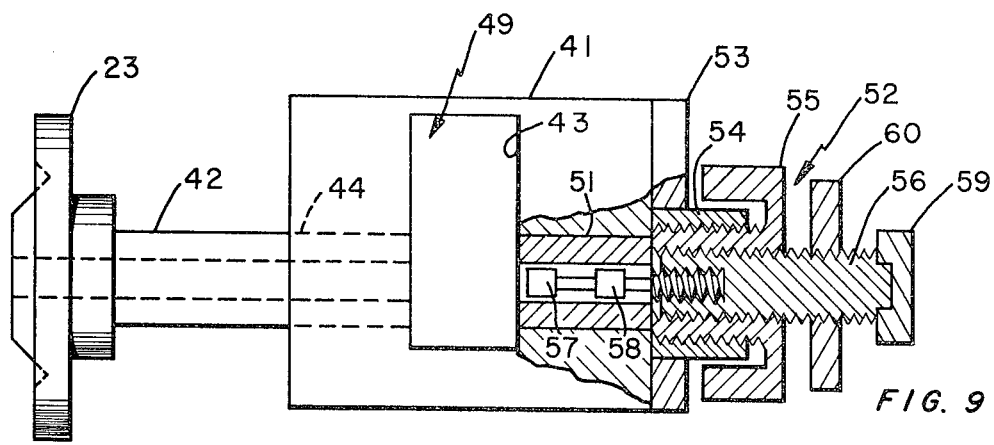
Figure 10:
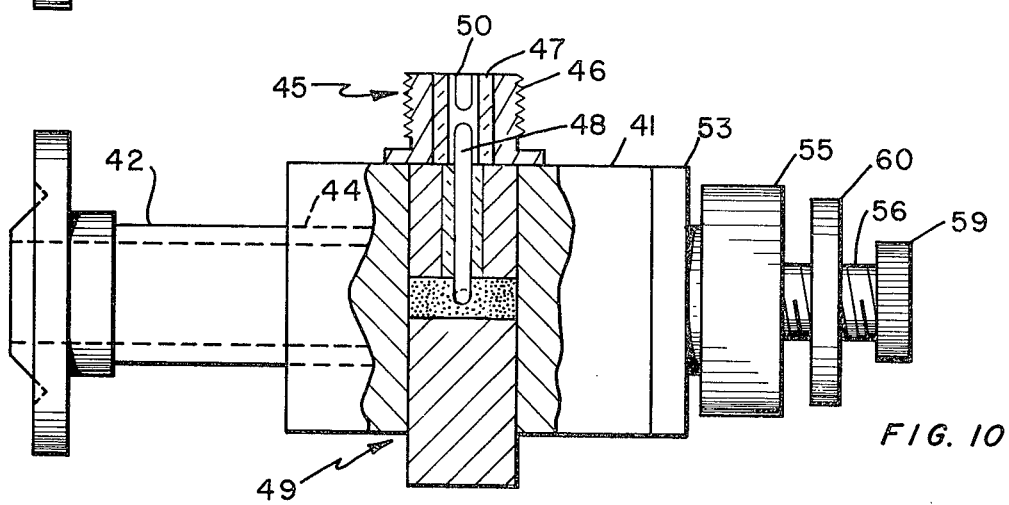
Figures 11, 12, 13:
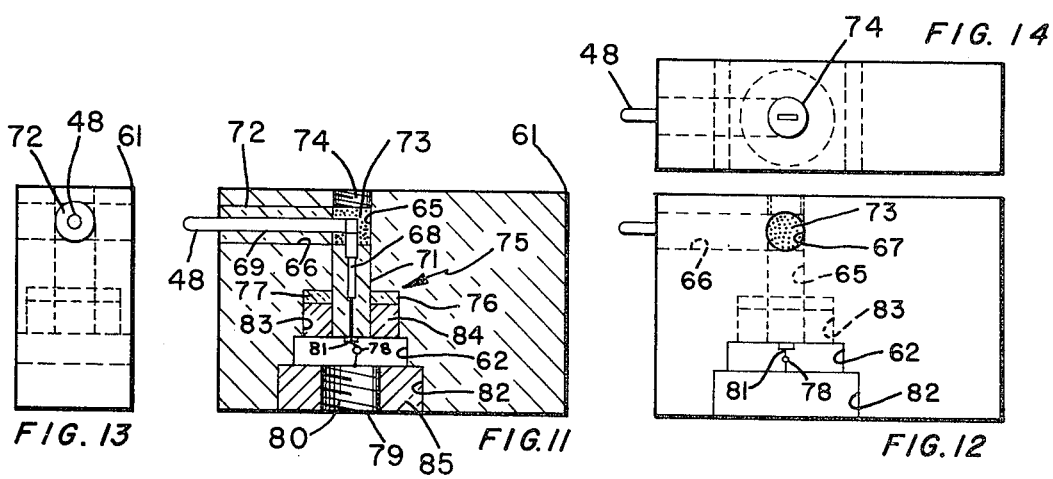
Figure 15:
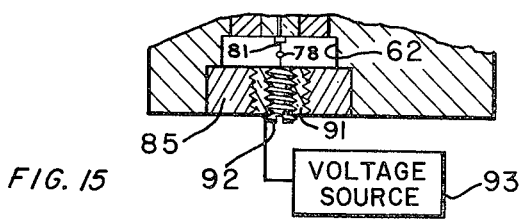

Other objects and features of the present invention will be apparent from the following specific description of embodiments of the invention taken in conjunction with the figures in which:

FIG. 1 is a front section view taken through the axis of the replaceable coaxial in-line translating device;
FIG. 2 is a front view of the in-line device;
FIG. 3 is a side view of the in-line device;
FIGS. 4 and 5 are front and side views of the in-line device cartridge;
FIG. 6 is a front section view of the cartridge;
FIG. 7 is a top section view of the cartridge showing the slot;
FIG. 8 is a front section view of another embodiment of the cartridge;
FIG. 9 is a side view of the replaceable wafer translating device;
FIG. 10 is a partially sectioned top view of the replaceable wafer device;
FIG. 11 is a side section view of the wafer;
FIGS. 12, 13 and 14 are side, front end and top views of the wafer; and
FIG. 15 is a partial sectional side view of another embodiment of the wafer.

The replaceable coaxial in-line detector translating device is generally a figure of revolution about the axis of the output coaxial line. The arrangement of parts is revealed by the sectional view shown in FIG. 1 and includes five principal subassemblies which are the output coaxial line connector 2, the coaxial line choke 3, the cylindrical cartridge 4, the waveguide 5 and the cartridge/waveguide holder 6.

The coaxial line connector 2 includes the connector shell 7 enclosing insulator 8 and center conductor 9. The ends of the center conductor 9 are bored at the lower end to accept the probe from the cylindrical cartridge and at the upper end to accept the center conductor of a coaxial line (not shown). The coaxial connector 2 threadably attaches to the holder assembly 6 by the coax connector adapter 10 which is attached to the holder assembly housing 11. This attachment may be by force fit along line 12 or the housing and adapter may be brazed together.

The waveguide 5 is fixed and held within the housing 11 by the threaded bushing 13 which is fixed to the housing 11 by force fit along line 14 or by brazing. Both the housing and bushing are generally figures of revolution about the axis 1 except for slots formed in them transverse to the axis 1 to accommodate the waveguide which extends out the front and back of the detector as shown in side view FIG. 3. Thus, the holder assembly 6 is formed by attaching the adapter 10, the choke housing 11, the waveguide bushing 13 and the waveguide 5 fixedly together before the choke 3 and cartridge 4 are assembled with the holder assembly. Next, the choke assembly 3 including the choke bushing 16 and dielectric plug 17 are fit into the housing 11 and the device is ready for the cartridge 4.

The cartridge 4 is inserted from the bottom into a cylindrical opening through the bushing 13, waveguide 5 and housing 11 as shown in FIG. 1 with the cartridge center probe 15 projecting through the choke assembly 3 beyond the housing 11 as shown. Registration tabs 33a at the cartridge head fit into a slot in the head of bushing 13 and so insure proper positioning of the cartridge. Then the cartridge cover 18 is screwed on the bushing 13 so as to securely hold the cartridge in place. Next, the coax connector 2 is screwed into the adapter 10 so that the cartridge probe 15 fits into the bore at the lower end of the coaxial connector center conductor 9. Thereafter, a coaxial transmission line can connect to the fitting 19 of the coax connector with the center conductor of the line fitting into the bore 20 of center conductor 9.

The opening 21 in the cartridge is preferably the same size and in registry with the inside 22 of the waveguide when the cartridge and waveguide are assembled. Since the dimensions of the inside of the waveguide determine the cut off frequency of the waveguide, each cartridge is tailored for a selected useful frequency range. However, the cartridge diameter may be the same for a number of frequency bands. That is, cartridges of the same diameter may have different size openings 21 as required to match the inside of the corresponding waveguide. Full advantage is taken of this feature to provide a family of wave translating devices for which the outside dimensions of all waveguides and cartridges are the same and so the rest of the parts into which the waveguide and cartridge fit are interchangeable. The inside dimensions of a waveguide are selected in view of the frequency band of operation. The openings 21 in the cartridge substantially match the inside of the waveguide and are preferably slightly larger to avoid mismatch. The choke assembly 3 including the choke bushing 16 and dielectric 17 which may be a disc-shaped piece and form a radial choke. A choke bushing and dielectric piece in combination are each designed for a particular operating frequency band associated with a given cartridge opening 21 and waveguide opening 22. Thus, after a given cartridge is assembled with the holder assembly 6, a choke assembly 3 particularly suited for that cartridge is selected and assembled over the probe 15 with the disc-shaped dielectric piece 17 abutting the end of the cartridge insert. The coaxial connector assembly 2 is interchangeable and a given assembly may be used with a number of cartridge types for the same frequency band. Each coax connector assembly 2 must be dimensioned only to accommodate the adapter 10 of the holder assembly 6 and the probe 15 of the cartridge and since a range of different cartridges have the same size probe, this poses no difficulty.

FIG. 2 is a front view of the detector assembly taken as shown in FIG. 3 and FIG. 3 is a side view showing the detector assembly with the major subassemblies revealed by broken line and also showing the waveguide flange 23 at one end of the waveguide and a waveguide termination assembly 24 at the other end of the waveguide. The termination 24 may be a tuner as shown which provides a variable position reflective surface at the termination of the waveguide or it may be a non-reflective termination or a continuing waveguide to other high frequency equipment. The position of the reflective termination 25 in the waveguide is adjusted by adjusting screw 26 to insure an impedance match between the waveguide and the opening 21 in the cartridge 4. It also reduces the effect of stray reflections from the element loaded in the cartridge. The broken lines in FIG. 3 reveal the outline of the subassemblies which are the coaxial connector 2 and the cartridge/waveguide holder 6, the cartridge 4, waveguide 5 and the choke 3. It is clearly an advantage to employ as many interchangeable or standard parts as possible in the manufacture of a line of detectors for different frequency bands. The subassembly of most limited use is the choke 3, because the radial dimension of the inside of the bushing 16 must be a quarter wave length of the millimeter wave frequency which the choke is designed to short circuit. Thus, cartridges designed for different frequency bands must be assembled with different chokes to achieve an effective device. Likewise, the waveguide opening determines the lower millimeter wave frequency cut off of the whole device, but, a single waveguide can generally be used over a wider range of frequency bands than a given choke assembly and a given cartridge is at least as versatile as a given waveguide. And so in a given translator device, the choke can be changed readily to selectively eliminate undesirable high frequencies in the output coaxial connector 2 and the cartridge can be readily removed and replaced with one of the same kind or another kind. For example, a cartridge loaded with a detector can be replaced by a cartridge loaded with a mixer or a multiplier diode, thermistor or a bolometer or any sort of element which couples with the millimeter waves conducted by the waveguide to detect or produce the output signal. And so a line of different kinds of wave translator devices of the type shown in FIGS. 1 to 3 for different frequency bands can be provided with a number of interchangeable parts. There results a reduced number of different parts which much be fabricated and corresponding reduced costs.

FIGS. 4 to 7 reveal the details of the cartridge 4. A cylindrical shell 31 is slotted to define the opening 21 of the same shape and size (or slightly larger than) the inside 22 of the waveguide. This may be accomplished by cutting in the front and back of the shell 31 as shown in FIGS. 5 and 7. FIG. 7 is a cross section view of the cartridge taken as indicated by line 7—7 in FIG. 5. Above the cut, the shell is loaded with the probe dielectric 32 and the probe 15. Below the slot, the shell is loaded with the tab base plug 33 which is metal and threaded to accommodate the element adjusting screw 34 which is also metal. The element 35 is mounted to one end of the adjusting screw 34 on a pedestal 36 and a wire or whisker 37 makes electrical connection from the element to the probe 15. This connection may be adjusted by rotating the adjusting screw 34 to move the element up or down within the opening 21. The screw 34 and the plug 33 define a conductive wall of the opening 21 and this wall aligns with the corresponding inside wall of the waveguide. This alignment is accomplished by adjusting the screw 34 within the cartridge and by adjusting the position of the cartridge in the waveguide by turning the cartridge cover 18. Tightening or loosening the cover 18 moves the whole cartridge 4 up or down inside the waveguide 5. Thus, registration of the cartridge opening 21 with the inside of the waveguide 22 is adjusted.

As already mentioned, the element may be a detector diode, a multiplier diode, a mixing diode or crystal, a Wollastan wire bolometer which is a square law detector, or a thermistor. These elements are well known in the art and their use in conjunction with high frequency waves is well known. They all respond to millimeter wave frequencies to produce low signals of known kind. For example, the diode detector will produce a dc level indicative of the amplitude of the millimeter wave frequency conducted in the waveguide and a semiconductor diode or crystal mixer will produce the mixed frequency of two millimeter wave frequencies conducted by the waveguide. A multiplier diode will provide a higher frequency than the frequency conducted by the input or fundamental in the waveguide. In any of these, it is desirable that a designated waveguide frequency not pass through to the coaxial connector and it is the function of the choke to block that frequency.

An alternate embodiment of the cylindrical cartridge shown in FIG. 8 includes between the adjusting screw 34 and the tab base plug 33 an insulative sleeve 38 which threadably attaches to both and insulates one end of the element from the rest of the detector. In this embodiment, a control voltage from source 39 can be applied to the element for modulating or controlling its operation.

Turning next to FIGS. 9 and 10 there is shown another embodiment including a replaceable wafer rather than a cylindrical cartridge. Here, the detector housing 41 is a substantially rectangular block which contains an extension 44 of the waveguide 42. Within the block is a transverse wafer slot 43 which cuts across the waveguide 44 contained in the block, substantially transverse thereto. A side view of the structure is shown in FIG. 9 looking into the slot 43 and the top view is shown in FIG. 10 with the block partially broken away to reveal the slot which extends across the block, and also reveals the double ended female coaxial connector 45 fixed to the block. The connector includes a threaded shell 46, dielectric 47 and double ended female center conductor 50 into which the probe 48 from the wafer 49 projects. At assembly, the wafer 49 is inserted into the slot 43 so that the wafer probe 48 projects into the connector 45 and is held in place by waveguide section 51 which is pressed against the wafer by the combination waveguide locking and tuning mechanism 52.

The mechanism 52 is mounted to the plate 53 that covers the back end of the device. The mechanism includes a threaded sleeve 54 fixed within a hole in the plate 53. The waveguide locking nut 55 threadably fits the sleeve and screws in to press against one end of the waveguide section causing it to press against and secure the wafer. The nut 55 is bored and threaded to accommodate tuning screw 56 from which projects the pair of shorting blocks 57 and 58 into the waveguide section 51. The blocks are spaced ¼ wavelength apart and tune the waveguide section 51 so that the section in combination with the wafer matches the impedance of the input waveguide 42. Tuning is accomplished after the wafer is inserted and locked by waveguide section 51. The knob 59 at the end of the tuning screw is turned to tune and then locked by running lock nut 60 against nut 55.

The wafer is shown in side sectional view in FIG. 11 and side front and top views are shown in FIGS. 12, 13 and 14. The wafer is a conductive plate 61 containing a rectangular transverse opening (waveguide slot) 62 which matches the inside of the waveguide 44 and is in registry with the inside of the waveguide when the wafer is in place in the block 41. It is convenient to make the height of the waveguide slot 62 the same as the height of the inside of the waveguide, but to make the slot wider than the inside of the waveguide so that lateral displacement can result in impedance matching. Tuning screws may then be added to bring about further electrical match between the slot and the waveguide.

The output coaxial line from the slot 62 is defined by two holes drilled in the wafer. One hole 65 is drilled from the top of the wafer down to the slot and the other 66, is drilled from the front of the wafer to hole 65. A transverse hole 67 is drilled at the intersection of holes 65 and 66 to enable access to the center conductors 68 and 69 mounted in the holes 65 and 66 and enclosed therein by dielectric plugs 71 and 72, respectively. When these center conductors are joined, the hole 67 is filled with dielectric 73. The top end of hole 65 is threaded and plug 74 screwed in to complete the coaxial output line from the wafer. A radial choke 75 is formed in the wafer coupled to the coaxial output line. This choke is preferably located close to the waveguide slot 62. The choke is formed by radial cavity 76 of suitable dimensions, loaded with high dielectric constant material 77. A choke could also be formed by a transverse rectangular opening which would provide a portion of a radial choke and would be effective for some applications.

The non-linear element 78 is mounted in the waveguide slot 62 at the end of adjusting screw 79 which is screwed into a threaded hole 80 in the bottom of the wafer. A wire or whisker 81 from the element is pressed against the center conductor 68 when the screw is adjusted.

The wafer as shown and described is conveniently made by first cutting transverse slots in a blank wafer plate to define the slot 62 and a larger window slot 82 that extends to the bottom side of the wafer blank. Then a hole 83 is drilled from the bottom of the wafer blank, centered in the slots 62 and 82, to the diameter of the radial cavity 76. Then holes 65 and 66 are drilled as described and a ring consisting of ring conductive plug 84 and dielectric 77 is pressed into the hole 83 above slot 62 so that the plug 84 defines part of the top inside surface of the slot 62 and the dielectric ring 77 defines the choke cavity. Next the window plug 85 is fitted into the slot 82 and brazed in place. This plug contains the threaded hole to accommodate the adjusting screw 79. Then the coaxial line center conductors 68 and 69 encased in dielectric plugs 71 and 72 are loaded in the holes 65 and 66, respectively, and these are joined by welding or other suitable bonding technique, at the access hole 67 which is then filled with dielectric 73. Then plug 74 is screwed in to seal the coaxial line. Finally the screw 79 with the element 78 mounted to the end is screwed into the window plug 85 so that the wire 81 from the element contacts the end of center conductor 68.

The center conductor 68 may be shaped to provide a transformer coaxial line section between the waveguide slot 62 and the coaxial line that connects to the connector 45. For this purpose, the dimensions of the hole 66 and center conductor 69 are such that the impedance of this section of the coaxial line in the wafer matches the impedance of the connector 45 and the line which connects to it. The upper end of center conductor 68 is the same diameter as center conductor 69 and conductor 68 tapers to a substantially smaller diameter where it contacts the element in slot 62. The taper may be continuous from one end to the other of conductor 68 or it may be in ¼ wavelength steps as shown in FIG. 11. By this technique, the impedance of the coaxial line can be varied substantially from one end to the other from 50 ohmes at the end which connects to connector 45 to over 200 ohms at the end coupled to the waveguide slot 62.

An alternate embodiment which is electrically similar to the cylindrical cartridge shown in FIG. 8 is shown in FIG. 15. It includes a threaded insulative sleeve 91 which is screwed into the tapped hole in plug 85 and contains a conductive adjustment screw 92 to which the element 78 is mounted and so one end of the element is electrically insulated from the waver and may be coupled to a control voltage source 93 for controlling operation or bias of the element.

A single housing 41 and waveguide 42 can accommodate a great number of different wafers loaded with different types of elements and/or containing different chokes 75 and the wafer is readily removed and replaced. It is removed by merely loosening the waveguide locknut 55 and removing the wafer 49 from the slot 43. Furthermore, the element 78 in a given wafer can be changed by removing the adjustment screw 79 which also removes the wafer and substituting another adjustment screw with a different element mounted on it. In this manner a single wafer can be loaded with a detector diode, a multiplier diode, a bolometer, a thermistor, etc.

Specific embodiments of the invention described herein include a removeable insert (cartridge or wafer) that is loaded with a wave translating element of selected type and the insert is designed for operation over a frequency band which may be the same or more narrow than the operating band of the input waveguide. Thus, each device may accommodate a number of different inserts containing different sorts of elements and designed for operation over different frequency bands. Furthermore each insert may accommodate a number of different elements and so the devices provided are versatile and a number of translating devices can be provided for different translating functions and different frequency bands using many of the same parts. The disclosed embodiments are particularly illustrative and many modifications will be apparent to those skilled in the art within the scope of the accompanying claims.

We claim:

1. In a high frequency wave translating device including an input waveguide transmission line structure designed for conducting millimeter waves and an output coaxial transmission line structure, means coupling said input and output structure comprising, a housing which contains the input waveguide structure, a slot in the housing extending perpendicular to the input waveguide, an electrically conductive flat plate insert which fits into the slot and contains the output coaxial line structures, an opening through the plate transverse to the plane thereof, in registration with and forming a continuation of the input waveguide, a wave translating element mounted in said opening for coupling electrically with both the input and output structures by electrically connecting to the waveguide and to the center conductor of the coaxial line, and a high frequency wave choke defined by a coaxial cavity in the plate adjacent the opening between the opening and the output coaxial line structure, concentric with and along said output line for preventing millimeter waves conducted by the input structure from being conducted to the output structure, an electrically conductive ring plug in the coaxial cavity completing the choke coaxial cavity and partially defining the plate opening and an electrically conductive window plug in an edge of the plate completing the plate opening.

2. A device as in claim 1 wherein, the window plug contains an opening in registration with the position of the mounted element, and an adjusting member fits into the window plug opening carrying the element at one end thereof.

3. A device as in claim 2 wherein, the adjusting member is electrically conductive.

4. A device as in claim 2 wherein, the adjusting member is electrically insulating.

5. A device as in claim 4 wherein, the adjusting member includes an electrically conductive center portion that connects to the element, extends to said edge of the plate and is insulated from the plate, whereby, a voltage different from the voltage of the plate may be applied to the element.

* * * * *